United States Patent [19]

Ohtsuchi et al.

[11] Patent Number: 5,111,052
[45] Date of Patent: May 5, 1992

[54] RADIATION SENSOR AND A RADIATION DETECTING APPARATUS USING THE SAME

[75] Inventors: Tetsuro Ohtsuchi, Osaka; Hiroshi Tsutsui, Yawata; Koichi Ohmori, Toyonaka; Sueki Baba, Suita; Hiromasa Funakoshi, Hirakata; Toshiyuki Kawara, Kadoma; Yoshiyuki Yoshizumi, Hirakata, all of Japan

[73] Assignee: Matsushita Electric Industrial Co., Ltd., Osaka, Japan

[21] Appl. No.: 435,219

[22] Filed: Nov. 9, 1989

[30] Foreign Application Priority Data

Nov. 10, 1988 [JP] Japan .................. 63-284514
Jan. 26, 1989 [JP] Japan .................... 1-17132

[51] Int. Cl.⁵ ................................ G01T 1/24
[52] U.S. Cl. ................... 250/370.01; 250/370.06
[58] Field of Search ........... 250/370.01, 370.1, 370.06; 357/68

[56] References Cited

U.S. PATENT DOCUMENTS 4,937,453 6/1990 Nelson .................. 250/370.1

FOREIGN PATENT DOCUMENTS 117286 5/1988 Japan .................. 250/370.01

*Primary Examiner*—Carolyn E. Fields
*Attorney, Agent, or Firm*—Panitch Schwarze Jacobs & Nadel

[57] ABSTRACT

A radiation sensor for the measurement of photo energies of incident radiation is disclosed which comprises a semiconductor substrate sensitive to photons of the incident radiation, at least one common electrode and at least one split electrode, both of which are disposed on the same surface of the substrate, or the common electrode being disposed on one surface of the substrate and the split electrode being disposed on the other surface of the substrate at a diagonal position to the common electrode. Also disclosed is a radiation detecting apparatus using the above-mentioned radiation sensor.

41 Claims, 11 Drawing Sheets

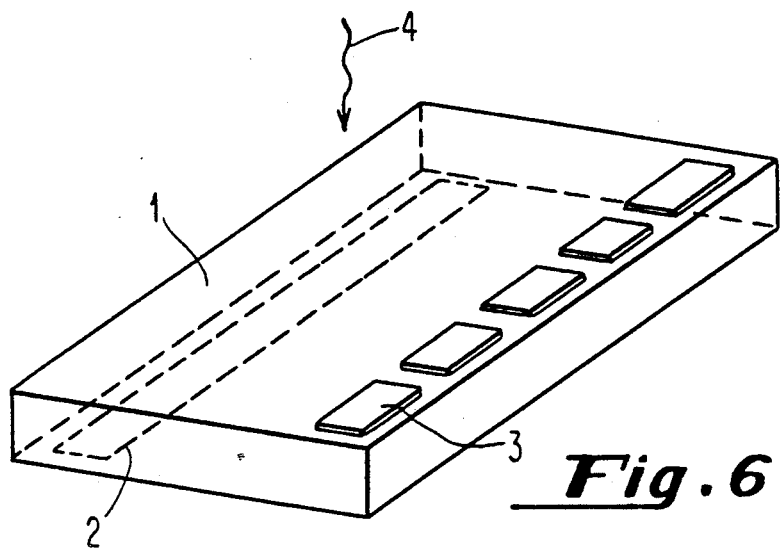
Fig. 5
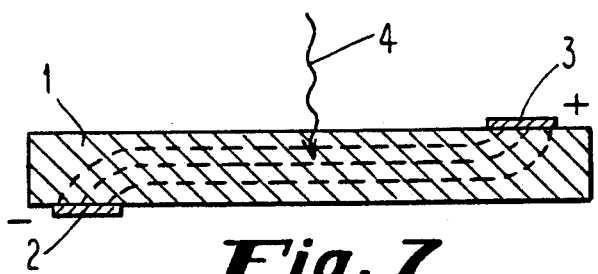
Fig. 6
Fig. 7
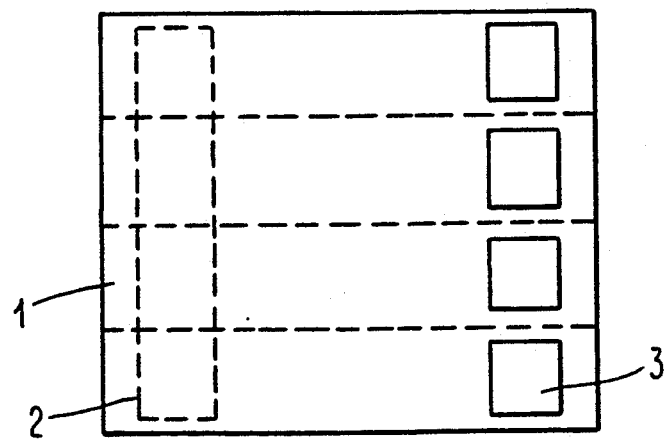
Fig. 8

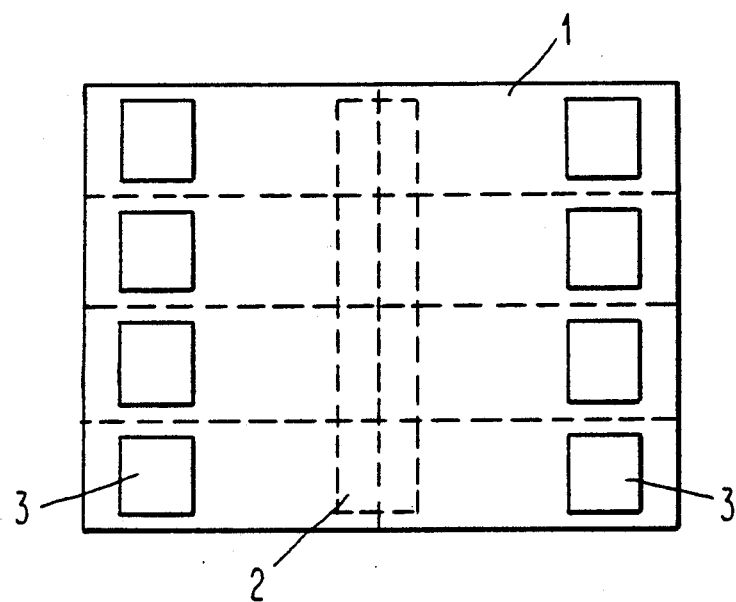
_Fig. 12a_
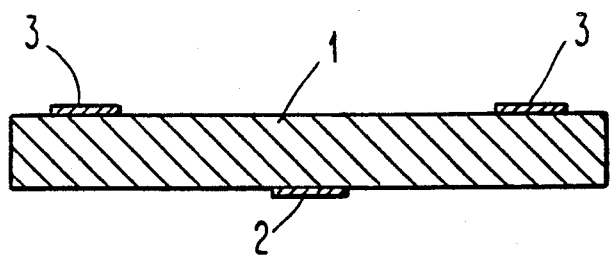
_Fig. 12b_

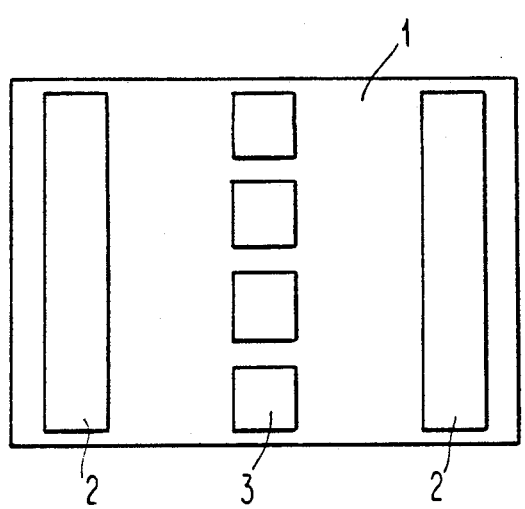
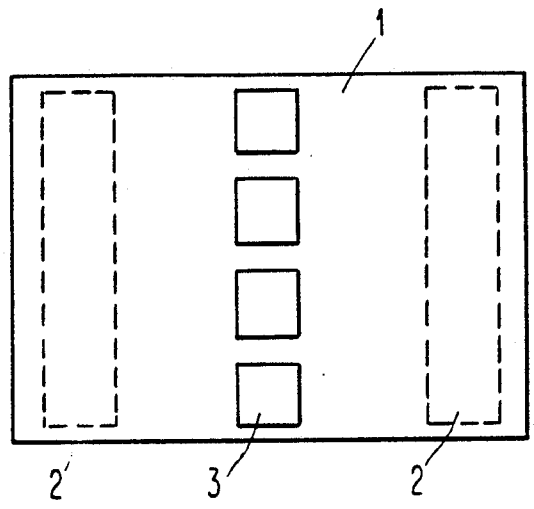
Fig. 15  Fig. 16
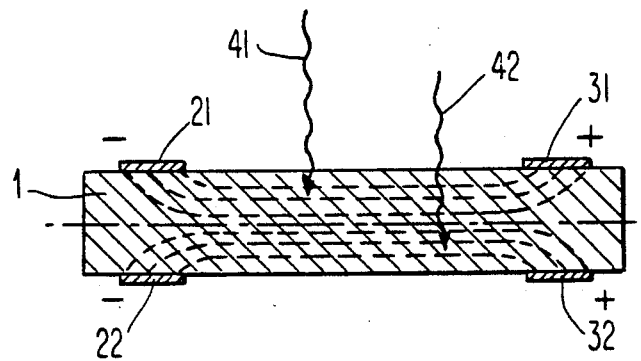
Fig. 17
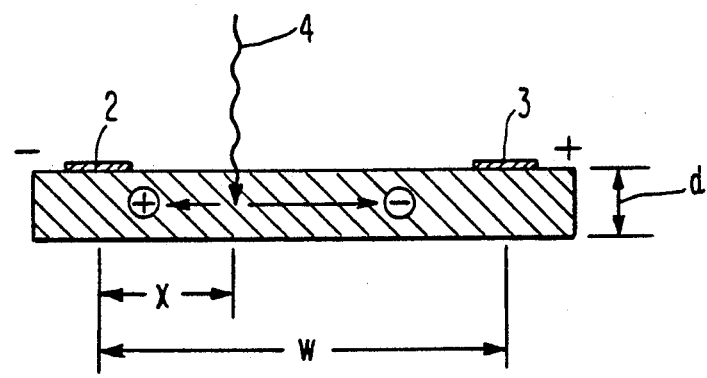
Fig. 18

RADIATION SENSOR AND A RADIATION DETECTING APPARATUS USING THE SAME

BACKGROUND OF THE INVENTION

1. Field of the Invention

The present invention relates to a radiation sensor, which is used in micro-radiation detecting apparatuses for the purpose of analyzing the radiation energy spectrum, diagnostic X-ray radiographic apparatuses, nondestructive inspection apparatuses, bone densitometer, and the like. The present invention also relates to a radiation detecting apparatus using the radiation sensor.

2. Description of the Prior Art

FIG. 26 shows a conventional semiconductor radiation sensor of totally depleted layer type, in which on the upper surface and the back surface of a semiconductor substrate 1, a split electrode 2 and a common electrode 3 are provided, respectively. The electric charges generated in the semiconductor substrate 1 by radiation 4 are detected by the application of a voltage between the electrodes 2 and 3. According to Ramo's theorem, a current produced by the movement of the electric charges is given as follows:

$$i = q \cdot dx/dt \quad (I)$$

where q is the amount of electric charge generated and dx/dt is the drift velocity of the electric charge.

For the purpose of energy spectrum analysis of radiation, a current i in Equation I is integrated to obtain the amount of electric charge generated as follows:

$$Q = \int i \, dt \quad (II)$$

Thus, the output current from the detector, which is due to electrons and positive holes, is converted to the amount of electric charge by means of an integration circuit of an external measuring instrument, resulting in a measured value.

However, in cases where an external measuring instrument which utilizes an integration circuit is used, although the height of an output pulse is proportional to the photon energy of the incident radiation when the radiation incident upon the detector includes a small number of photons, miscount of photons will occur when the incident radiation includes an increased number of photons and also the incident rate is shorter than the time constant of the integration circuit used.

To solve such a problem, some measurement systems use a high-speed pulse amplifier in place of the integration circuit. Such measurement systems work satisfactorily when electrons and positive holes have a similar mobility (i.e., drift velocity of electric charge in a constant electric field) such as in cases where the substrate is made of Si or Ge. However, when electrons and positive holes have different mobilities as in cases where the substrate is made of a compound semiconductor such as GaAs, CdTe, CdSe, or HgI$_2$, the following problems will arise. When the measurement of current produced by either of electric charges (i.e., electrons or positive holes) is attempted, because the electric charges generated in the vicinity of a collector electrode have a very short transit time, it results in a very low gain when the electric charges pass the pulse amplifier as a current pulse. Consequently, the height of the output current pulse from the pulse amplifier depends on the position at which the electric charges are generated.

Moreover, when both electrodes are arranged parallel to the incident direction of radiation, mounting of a sensor becomes difficult.

SUMMARY OF THE INVENTION

The radiation sensor of this invention, which overcomes the above-discussed and numerous other disadvantages and deficiencies of the prior art, comprises a semiconductor substrate sensitive to photons of incident radiation, at least one common electrode and at least one split electrode, both of which are disposed on the same surface of the substrate.

In a preferred embodiment, a combination of a common electrode and a split electrode is disposed in parallel with each other.

In a preferred embodiment, a common electrode is disposed at the center of the surface of the substrate and two split electrodes are disposed on both sides of the common electrode.

In a more preferred embodiment, the two split electrodes are shifted to each other by a half pitch.

In a preferred embodiment, a split electrode is disposed at the center of the surface of the substrate and two common electrodes are disposed on both sides of the split electrodes.

In a preferred embodiment, a first combination of a common electrode and a split electrode is disposed on one surface of the substrate and a second combination of a common electrode and a split electrode is disposed on the other surface of the substrate symmetrically with the first combination of electrodes.

In a preferred embodiment, a passivation film is formed on the radiation-sensitive area of the substrate between the common electrode and the split electrode.

In a preferred embodiment, the common electrode has notches to form a symmetric distribution of the electric field between the common electrode and the split electrode.

In a preferred embodiment, the substrate is made of a semiconductor material selected from the group of CdTe, GaAs, GaSe, CdSe, HgI$_2$, Si, and Ge.

The radiation sensor of another type of this invention comprises a semiconductor substrate sensitive to photons of incident radiation, at least one common electrode and at least one split electrode, the common electrode being disposed on one surface of the substrate and the split electrode being disposed on the other surface of the substrate at a diagonal position to the common electrode.

In a preferred embodiment, a common electrode is disposed on one surface of the substrate and a split electrode is disposed on the other surface of the substrate at a diagonal position to the common electrode.

In a preferred embodiment, a common electrode is disposed at the center of one surface of the substrate and two split electrodes are disposed on the other surface of the substrate at positions on both sides of the common electrode.

In a more preferred embodiment, the two split electrodes are shifted to each other by a half pitch.

In a preferred embodiment, a split electrode is disposed at the center of one surface of the substrate and two common electrodes are disposed on the other surface of the substrate at positions on both sides of the split electrode.

In a preferred embodiment, a passivation film is formed on the radiation-sensitive area of the substrate.

In a preferred embodiment, the common electrode has notches to form a symmetric distribution of the electric field between the common electrode and the split electrode.

In a preferred embodiment, the substrate is made of a semiconductor material selected from the group of CdTe, GaAs, GaSe, CdSe, HgI$_2$, Si, and Ge.

The radiation detecting apparatus of this invention comprises the above-mentioned radiation sensor and a pulse amplifier.

In a preferred embodiment, the radiation sensitive area of the sensor is limited by the disposition of a radiation shield so that the transit time of electrons or holes among electric charges generated by incident radiation is equal to or greater than the reciprocal time of a cutoff frequency of the pulse amplifier.

Thus, the invention described herein makes possible the objectives of (1) providing a radiation sensor in which miscount of photons does not occur and also the height of a current pulse is independent of the position of electric charge generation; (2) providing a radiation sensor by which incident radiation with a high counting rate can be measured without losing the energy information of the radiation; (3) providing a radiation sensor which can be very easily mounted as a multi-channel sensor because both electrodes are provided on the same surface or on the two different surfaces parallel to each other; (4) providing a radiation sensor in which both electrodes are arranged symmetrically on the two different surfaces parallel to each other of a semiconductor substrate, so that the information of incident radiation can be obtained even in the direction of absorption depth; and (5) providing a radiation detecting apparatus using the above-mentioned radiation sensor.

BRIEF DESCRIPTION OF THE DRAWINGS

This invention may be better understood and its numerous objects and advantages will become apparent to those skilled in the art by reference to the accompanying drawings as follows:

FIG. 5 is a sectional view showing the radiation sensor in which a passivation film is provided between the electrodes.

FIG. 6 is a perspective view showing another radiation sensor of this invention.

FIG. 7 is a sectional view showing the radiation sensor of FIG. 6.

FIG. 8 is a plan view showing the radiation sensor of FIG. 6.

FIGS. 11a and 11b, FIGS. 12a and 12b, FIGS. 13a and 13b, and FIGS. 14a and 14b are plan views and sectional views showing still another radiation sensors of this invention, respectively.

FIGS. 15 and 16 are plan views showing still another radiation sensors of this invention.

FIG. 17 is a sectional view showing still another radiation sensor of this invention.

FIG. 18 is a schematic sectional view of the radiation sensor of this invention showing the relationship between the incidence position of radiation and the movement of electric charges generated thereby.

DESCRIPTION OF THE PREFERRED EMBODIMENTS

The invention will be further explained in more detail by reference to the following examples together with the accompanying drawings.

EXAMPLE 1

Figure 1:
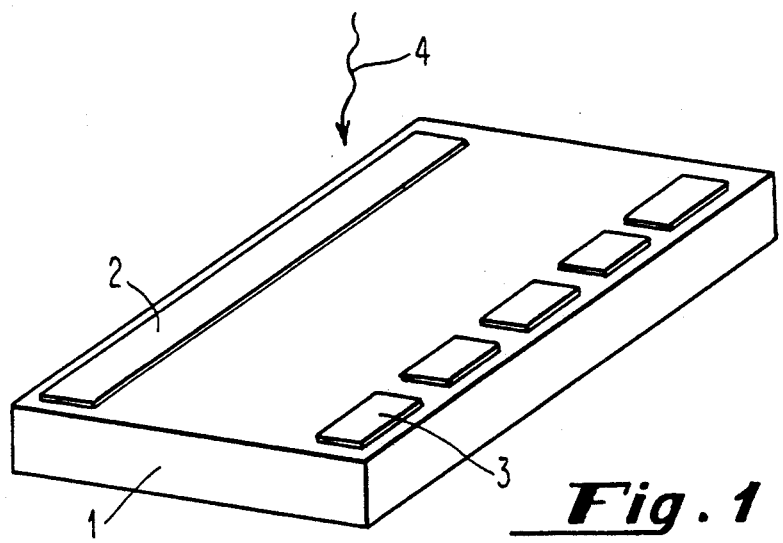
FIG. 1 is a perspective view showing a radiation sensor of this invention.

FIG. 1 is a perspective view showing a radiation sensor of this invention, in which a common electrode 2 and a split electrode 3 are provided on the same surface of a semiconductor substrate 1. In order to use the semiconductor substrate 1 as a totally depleted layer, ohmic electrodes are formed as the electrodes 2 and 3. The semiconductor substrate 1 can be made of an element semiconductor such as Si and Ge, or a compound semiconductor such as CdTe, GaAs, GaSe, CdSe, and HgI$_2$. For example, when the semiconductor substrate 1 is made of CdTe, the electrodes 2 and 3 should be made of Pt or Au. Radiation 4 is incident at right angles upon the surface of the substrate I on which these electrodes are formed.

Figure 2:
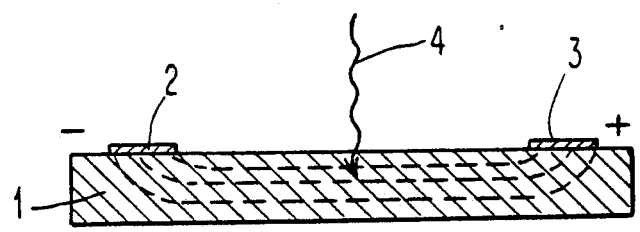
FIG. 2 is a sectional view showing the radiation sensor of FIG. 1.

FIG. 2 is a sectional view showing the radiation sensor of FIG. 1. In FIG. 2, broken lines indicate the electric lines of force when a voltage is applied across electrodes 2 and 3. As shown in this figure, the electric lines of force run parallel to the incident surface of the radiation 4. The electric charges generated by the radiation 4 which is incident upon the surface between the electrodes 2 and 3 are forced by the electric lines of force to move between the electrodes. Such a constitution allows the radiation sensor to obtain an output signal which is independent of the absorption depth of the radiation 4.

Figure 3:
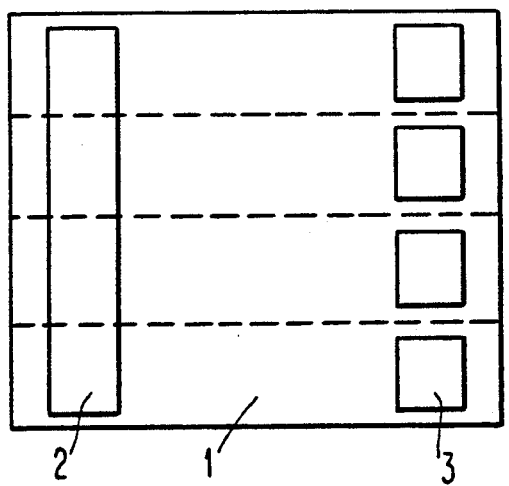
FIG. 3 is a plan view showing the radiation sensor of FIG. 1.

FIG. 3 is a plan view showing the radiation sensor of this example viewed from the side of the electrodes. Because the electric lines of force run at right angles to the common electrode 2, channels are separated from each other as shown by the broken lines in this figure.

Figure 4:
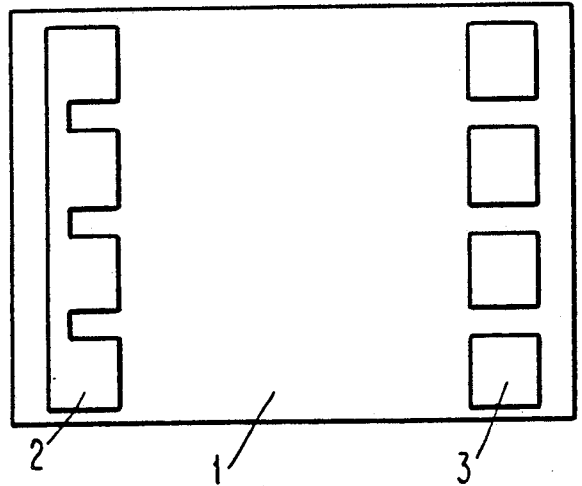
FIG. 4 is a plan view showing another example of a common electrode of the radiation sensor of FIG. 1.

The electric field in the space between the electrodes 2 and 3 can be made to distribute symmetrically by making notches in the common electrode 2 as shown in FIG. 4.

In the radiation sensor of this example, particularly when the semiconductor substrate 1 is used as a totally depleted layer, the surface condition between the electrodes 2 and 3 become significant. For example, in order to protect the surface of the semiconductor substrate 1 from moisture and contamination, a passivation film 5 made of $SiO_2$ is formed between the electrodes 2 and 3 which have been formed on the same surface of the semiconductor substrate 1 as shown in FIG. 5. The passivation film 5 may also be a thin film made of $Si_xN_{1-x}$ ($0<x<1$), SiC, or an organic compound. Here, it is important to form a passivation film which is symmetrical with respect to the electrode side, because the electric field is applied also to the surface of the substrate 1 on which no electrode is formed.

EXAMPLE 2

FIG. 6 is a perspective view showing another radiation sensor of this invention, in which a common electrode 2 is provided on one surface of a semiconductor substrate 1 and a split electrode 3 is provided on the other surface at a position diagonal to the common electrode 2. In order to use the semiconductor substrate 1 as a totally depleted layer in a similar manner to that of Example 1, ohmic electrodes are formed as the electrodes 2 and 3. Radiation 4 is incident upon the surface of the substrate 1 on which these electrodes are formed.

FIG. 7 is a sectional view showing the radiation sensor of FIG. 6. In FIG. 7, broken lines indicate the electric lines of force when a voltage is applied across the electrodes 2 and 3. As shown in this figure, in a similar manner to that of Example 1, output signals independent of the absorption depth of the radiation 4 can be obtained, because the electric lines of force run parallel to the incident surface of the radiation 4.

FIG. 8 is a plan view showing the radiation sensor of this example viewed from the side of the split electrode 3. Because the electric lines of force run at right angles to the common electrode 2, channels are separated from each other as shown by the broken lines in this figure.

Figure 9:
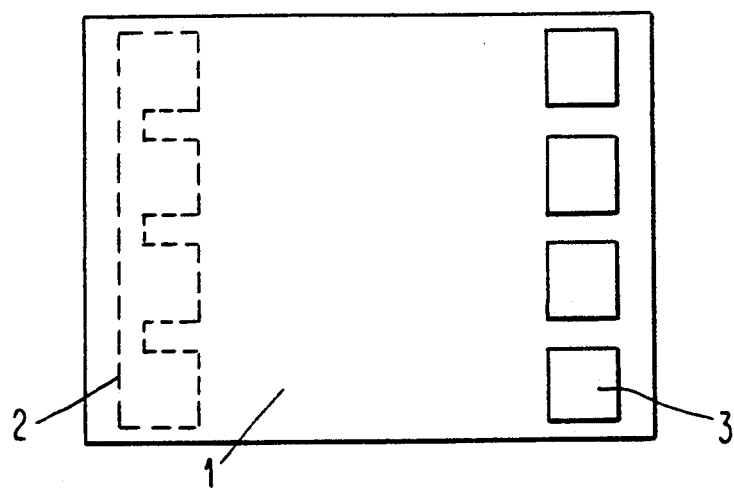
FIG. 9 is a plan view showing another example of a common electrode of the radiation sensor of FIG. 6.

The electric field in the space between the electrodes 2 and 3 can be allowed to distribute symmetrically by the formation of notches in the common electrode 2 as shown in FIG. 9.

Figure 10:
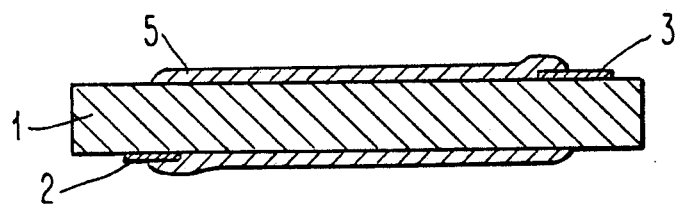
FIG. 10 is a sectional view showing the radiation sensor in which a passivation film is provided.

In the radiation sensor of this example, it is important to protect the surface of the semiconductor substrate 1 as in Example 1. FIG. 10 shows another radiation sensor of this example, which is provided with a passivation film 5. The passivation film 5 is formed in a similar manner to that of Example 1.

EXAMPLE 3

Figure 11A:
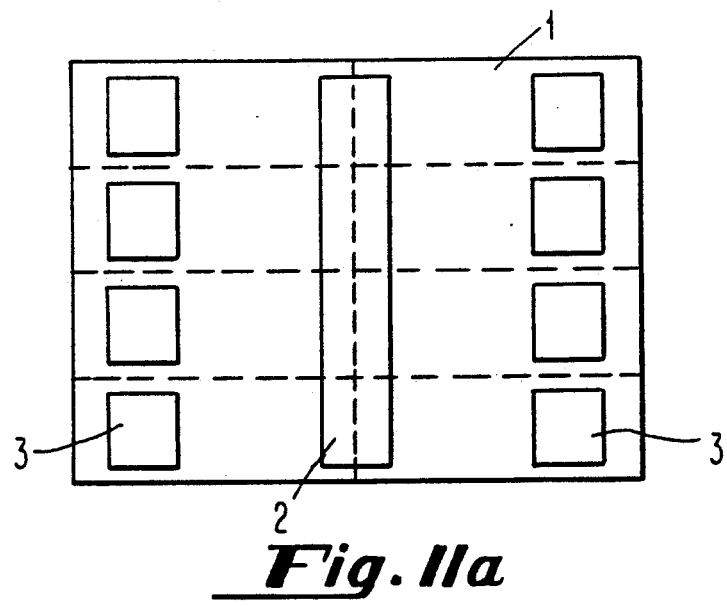
Figure 11B:
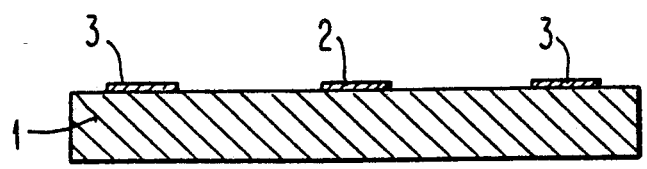
Figure 13A:
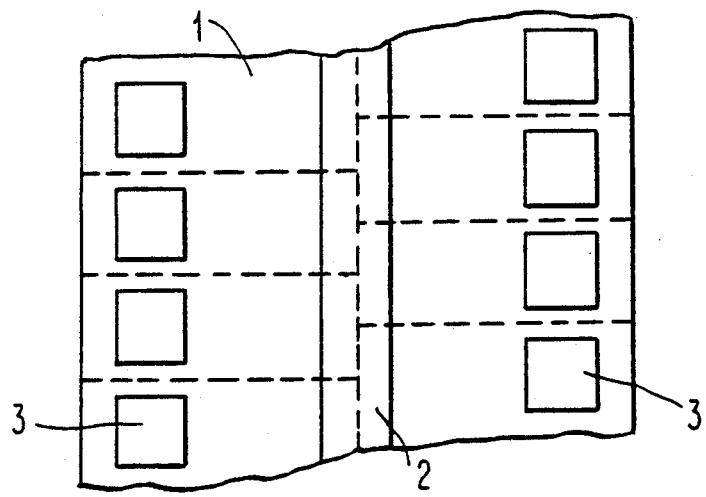
Figure 13B:
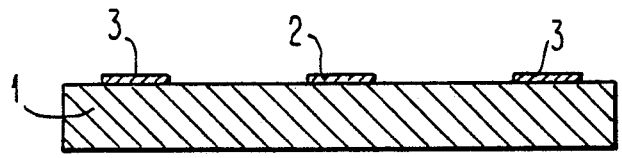
Figure 14A:
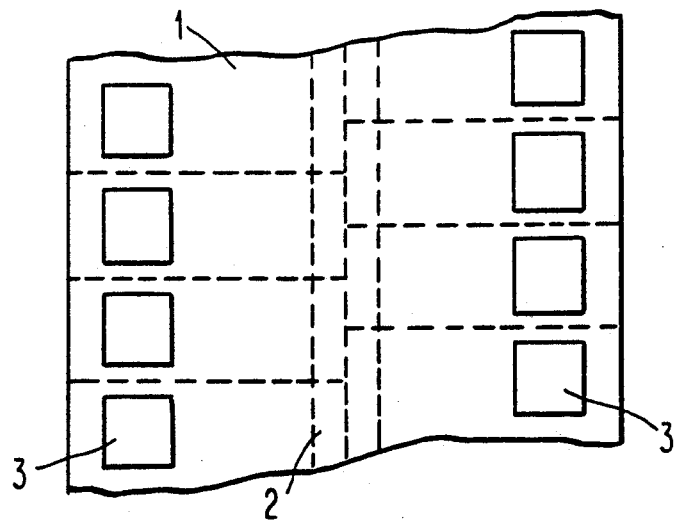
Figure 14B:
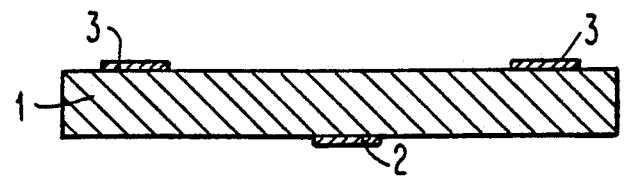

FIGS. 11a and 11b show still another radiation sensor of this invention, in which a common electrode 2 is formed at the center of one surface of a semiconductor substrate 1 and a pair of split electrodes 3 are formed on both sides thereof. FIGS. 12a and 12b show another constitution of the radiation sensor of this example, in which a common electrode 2 is formed at the center of one surface of a semiconductor substrate 1 and a pair of split electrodes 3 are formed on both sides of the other surface. As shown in FIGS. 13a and 13b and FIGS. 14a and 14b, spatial resolution can be improved without lowering the sensitivity of the sensor by the disposition of the split electrodes 3, which are formed on both sides of the common electrode 2, so that they are shifted to each other by a half pitch.

When the semiconductor substrate 1 is made of a material with a low lifetime of electric charges, the drift length of charge (i.e., the distance between the electrodes) cannot be made long, because the charge in trapped during its transit. Therefore, as shown in FIGS. 15 and 16, a split electrode 3 is formed at the center of one surface of a semiconductor substrate 1 and a pair of common electrodes 2 are formed on both sides of the same surface or the other surface. By this constitution, the distance between the electrodes 2 and 3 can be decreased without lowering the sensitivity of each channel.

EXAMPLE 4

FIG. 17 shows still another radiation sensor of this invention, in which the first combination of a common electrode 21 and a split electrode 31 is formed on one surface of a semiconductor substrate 1 and the second combination of a common electrode 22 and a split electrode 32 with the same configuration is formed on the other surface symmetrically to the first combination of electrodes. When a voltage is applied between the common electrode and the split electrode, the electric lines of force run as shown by the broken lines in this figure, resulting in an electric field distribution which is symmetrical with regard to the center line (i.e., the line with alternate long and short dashes) of the semiconductor substrate 1.

When radiation is incident upon one surface of the semiconductor substrate 1, most of radiation 41 with low energy is absorbed in the vicinity of the incident surface. Then, electric charges generated thereby move along the electric lines of force. Consequently, most of the radiation 41 with low energy is detected by the split electrode 31 as a current pulse. On the other hand, radiation 42 with high energy is absorbed by the entire semiconductor substrate 1 and therefore is detected by both the split electrodes 31 and 32 as a current pulse.

Thus, a radiation sensor having an energy discriminating function divided to particular energy levels can be obtained by taking into consideration the absorption coefficient and thickness of a semiconductor substrate.

EXAMPLE 5

Figure 19A:
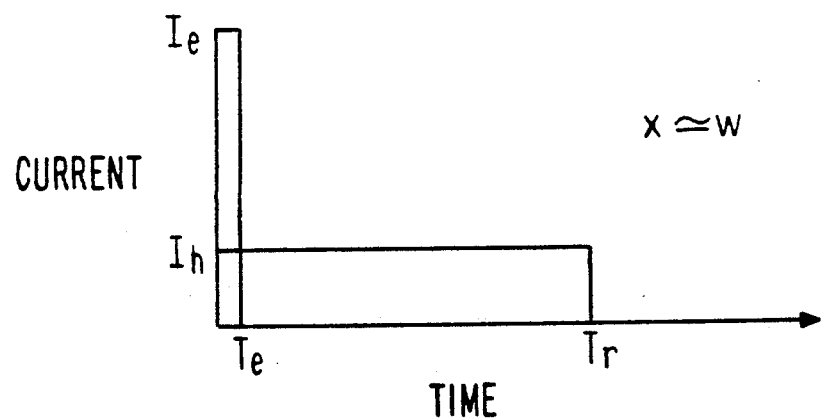
FIGS. 19a to 19c are diagrams showing the induced current pulse waveform due to the movement of the charge carriers.
Figure 19B:
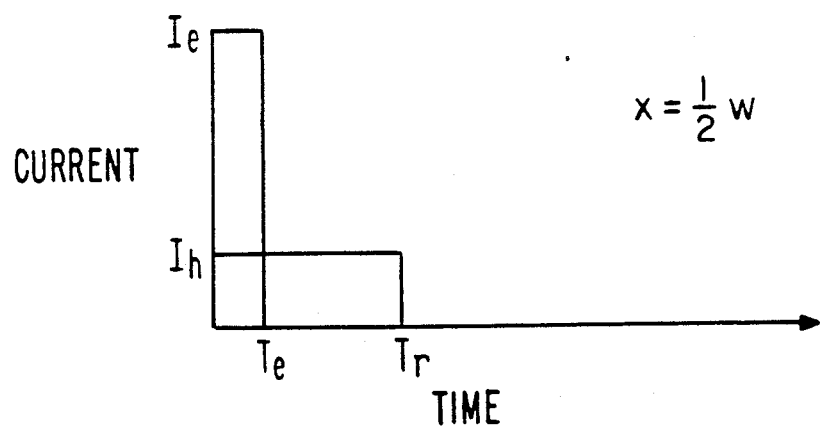
Figure 19C:
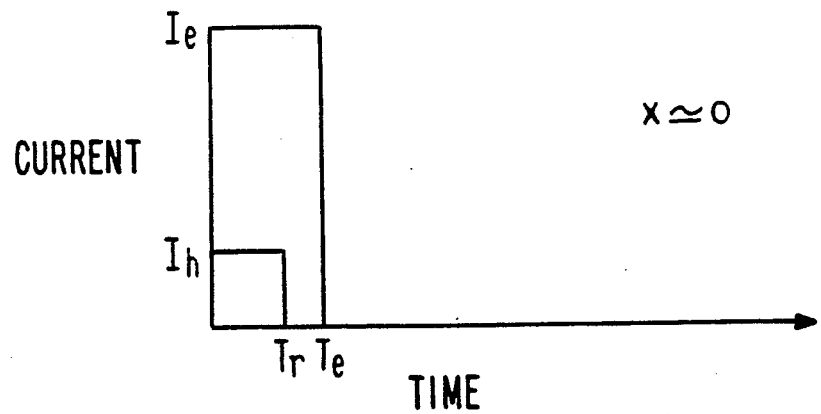

The following describes a method of further improving the energy resolution. FIG. 18 is a schematic sectional view showing the incidence position of radiation and the transit of electric charges generated thereby. When a voltage is applied between the common electrode 2 at negative electric potential and the split electrode 3 at positive electric potential, electrons and positive holes which have been generated move as shown in this figure. When the semiconductor substrate 1 is made of a compound semiconductor, electrons and positive holes have different mobilities. Assuming that the distance between both electrodes is w and the distance between the common electrode 2 and the incidence position of the radiation 4 is x, a current produced in this case is given by the following equation which is derived from Equation I.

$$i = q \cdot dx/dt \quad \text{(III)}$$
$$= q \cdot \mu \cdot E$$

where $\mu$ is the mobility and E is the electric field. FIGS. 19a to 19c show the relationships between the induced current and the position at which the electric charges are generated. Because the mobility of electrons is higher than that of positive holes in general, pulse height of induced current $I_e$ due to electrons is greater than that of induced current $I_h$ due to holes. An induced current waveform when x≃w is shown in FIG. 19a, an induced current waveform when x=w/2 is shown in FIG. 19b, and an induced current waveform when x≃0 is shown in FIG. 19c. As can be seen from FIGS. 19a to 19c, an induced current waveform is determined predominantly by electrons. The transit time $T_e$ of electrons is given as follows:

$$T_e = (w-x)/(\mu \cdot E) \quad \text{(IV)}$$

Figure 20A:
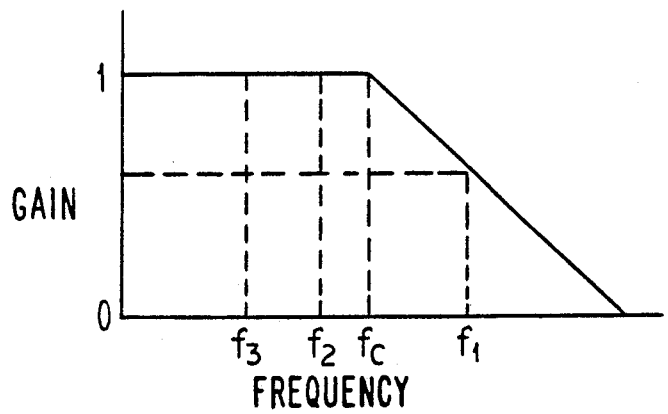
FIGS. 20a to 20d are diagrams showing the output current pulse waveforms with induced current pulse and frequency characteristics of a pulse amplifier.
Figure 20B:
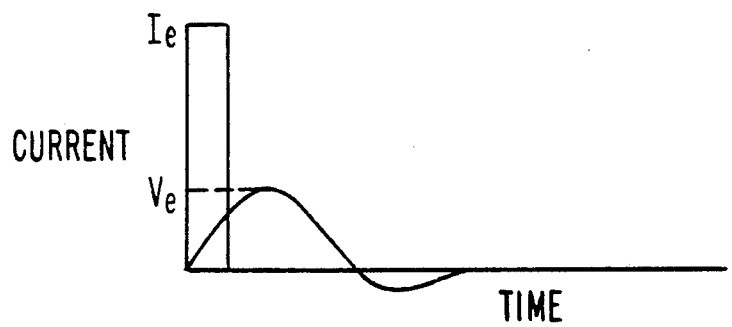
Figure 20C:
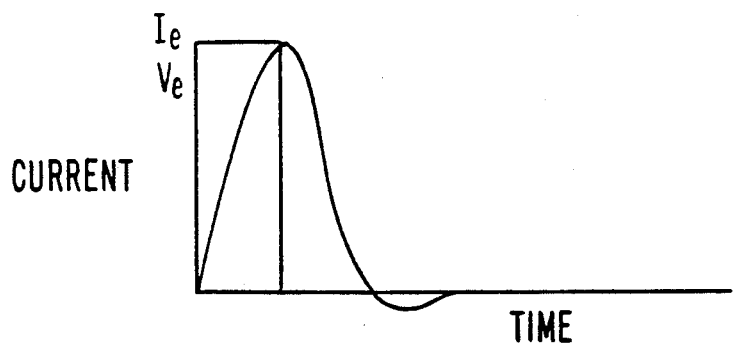
Figure 20D:
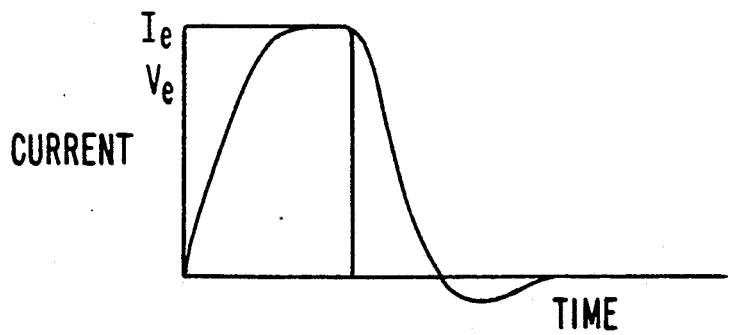

When $T_e$ is small, the observation of output current pulses is limited by the frequency characteristics of a pulse amplifier which is connected to the outside of the radiation sensor. FIGS. 20a to 20d show the frequency characteristics and output current pulse waveform $V_e$ of the pulse amplifier with induced current pulse $I_e$. FIG. 20a shows the frequency characteristics of the pulse amplifier, in which $f_c$ is a cutoff frequency of the pulse amplifier. When $T_e$ is extremely small so that $T_e < 1/f_c$, the height of the output pulse from the amplifier, $V_e$ is small, because the gain of the amplifier decreases in the region of the frequency greater than $f_c$ as shown in FIG. 20b. When $T_e$ is greater so that $T_e \geq 1/f_c$, however, the height of the output pulse from the amplifier, $V_e$ becomes constant as shown in FIGS. 20c and 20d. This condition can be formulated with the use of Equation IV as follows:

$$w - x > \mu \cdot E/f_c \quad \text{(V)}$$

When the semiconductor substrate is made of CdTe, substituting $\mu = 1,000$ cm$^2$/V·sec for the electron mobility, E = 1,000 V/cm for the electric field intensity and $1/f_c = 10^{-7}$ sec in Equation V, w−x=0.1 cm is obtained. This means that it is required to limit the incidence of radiation so that electrons generated by the radiation move over a distance not less than 0.1 cm.

Figure 21:
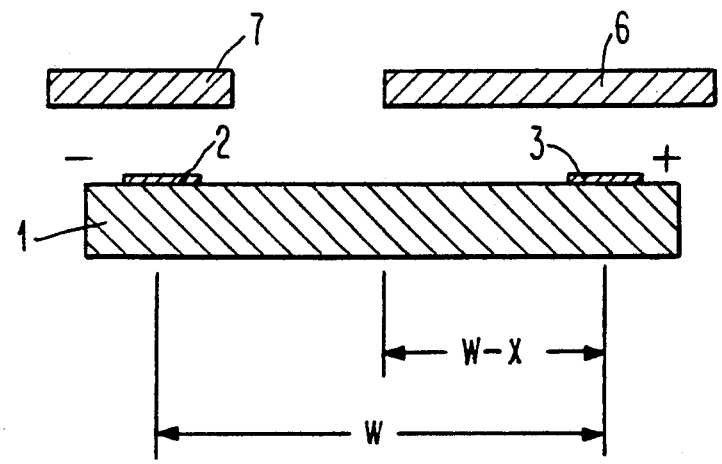
FIGS. 21 and 22 are sectional views showing still another radiation sensor of this invention, which is provided with a radiation incident window.
Figure 22:
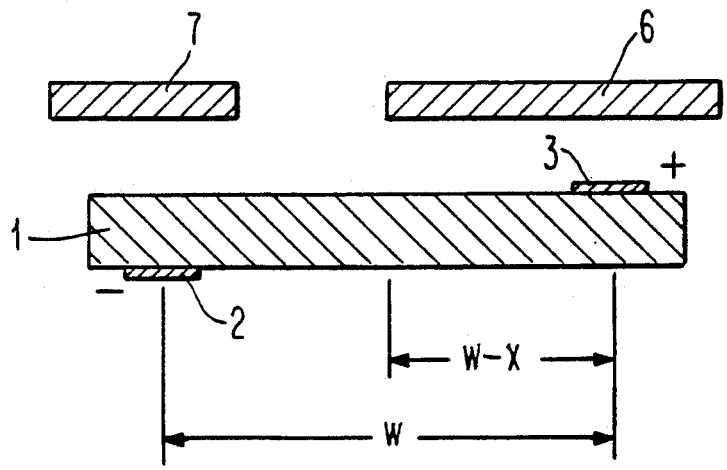

FIGS. 21 and 22 show a means of limiting the incidence of radiation. It can be achieved by providing a radiation shield 6 on the side of the split electrode 3 at a distance w - x from the split electrode 3. The effect can be further improved by providing another radiation shield 7 also on the side of the common electrode 2 over the portion of the substrate in which the electric lines of force are distorted.

EXAMPLE 6

Figure 23A:
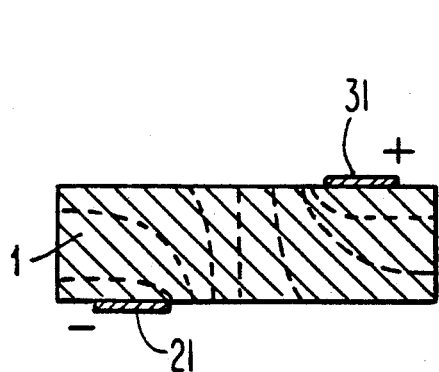
FIGS. 23a and 23b are sectional views of the radiation sensor of this invention showing the relationship between the absorption depth of radiation and the electric field intensity distribution and the relationship between the absorption depth of radiation and the output current generated thereby, respectively.
Figure 23B:
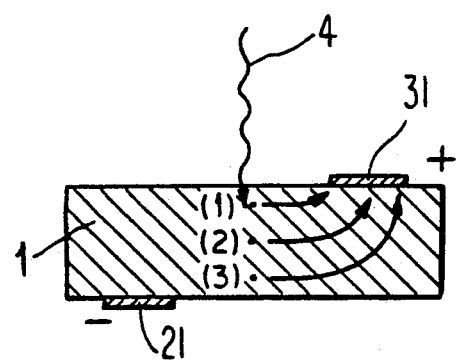
Figure 24A:
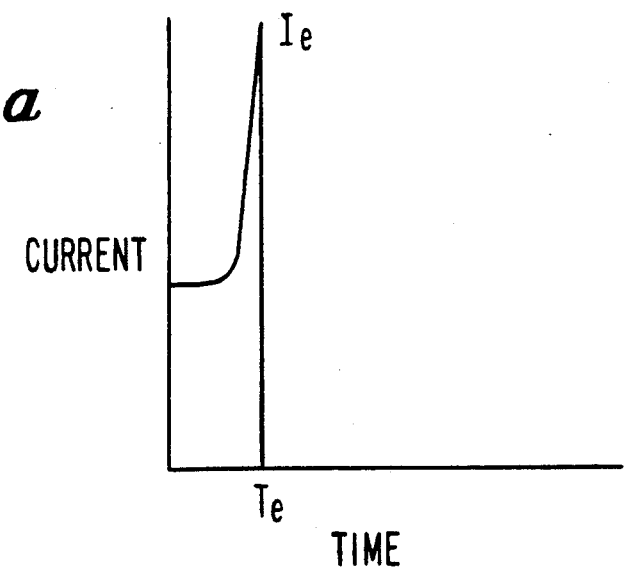
FIGS. 24a to 24c are diagrams showing the induced current pulse waveform due to the movement of the charge carriers shown in FIG. 23b.
Figure 24B:
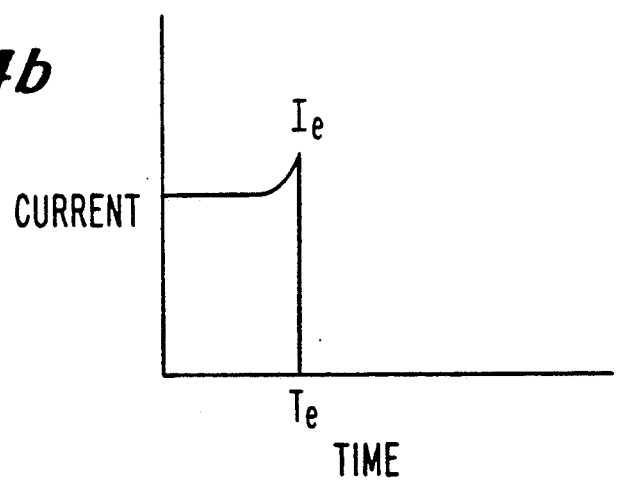
Figure 24C:
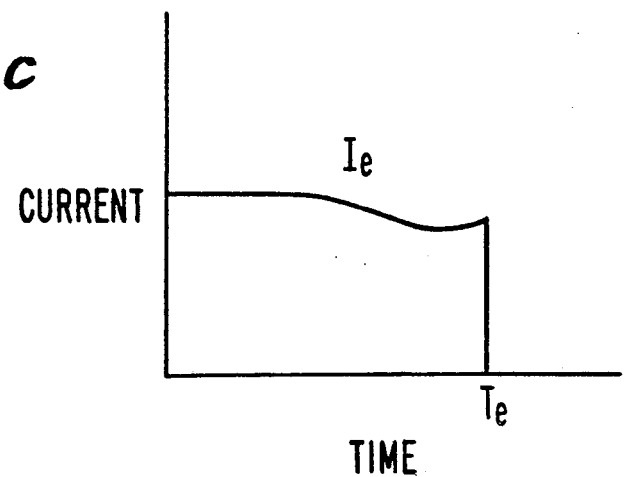

The energy resolution can be improved by utilizing the configuration effect of the radiation sensor of this invention. As shown in FIG. 23a, when the distance between the electrodes 21 and 31 is decreased in comparison with the thickness of the radiation sensor, the electric field distribution (i.e., equipotential distribution) is distorted to concentrate the electric field at the ends of the electrodes. FIG. 23b shows the traces of electric charges generated by radiation in a radiation sensor of such a configuration as described above. In particular, this figure shows the trace of electrons among the electric charges generated at the depths (1), (2), and (3) by the radiation 4. The drift velocity of the charge along this trace induces a current pulse in the split electrode 31. FIGS. 24a to 24c show the output current pulse waveforms. The induced current pulse waveforms shown in FIGS. 24a to 24c correspond to the positions (1), (2), and (3), respectively, at which the respective electric charges are generated as shown in FIG. 23b. As can be seen from FIGS. 24a to 24c, a great difference is found in the induced current pulse waveform $I_e$ and width $T_e$ near the electrodes.

Figure 25A:
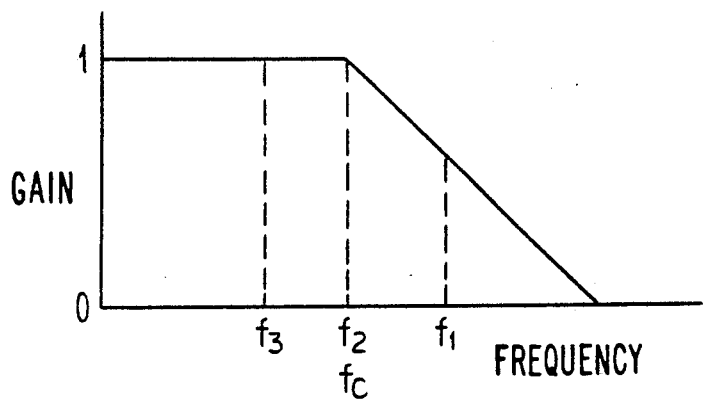
FIGS. 25a to 25d are diagrams showing the frequency characteristics and output pulse waveforms of a pulse amplifier with induced current pulse.
Figure 25B:
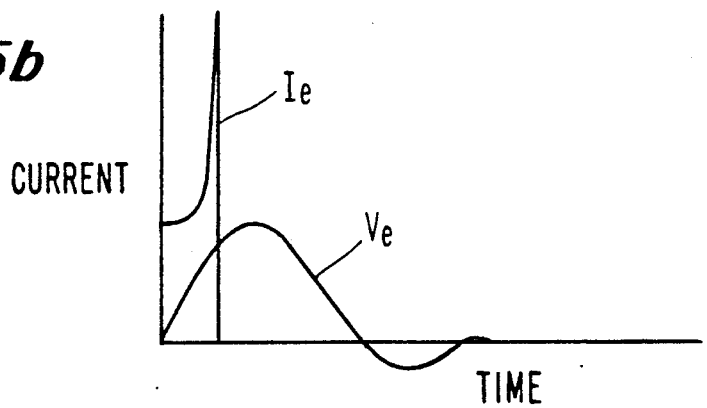
Figure 25C:
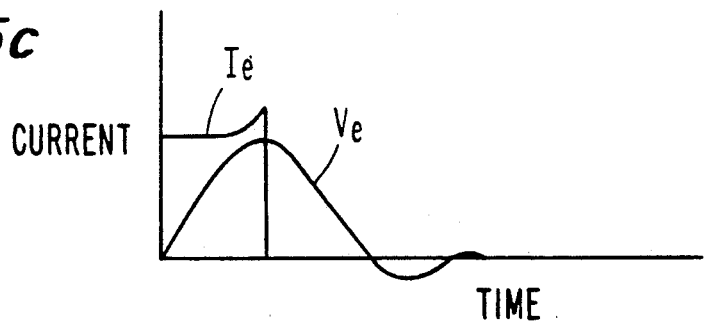
Figure 25D:
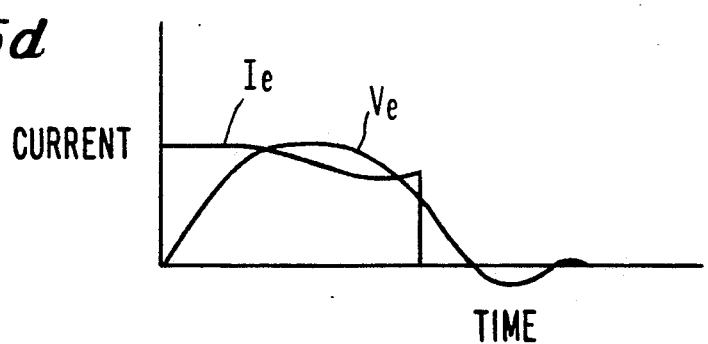
Figure 26:
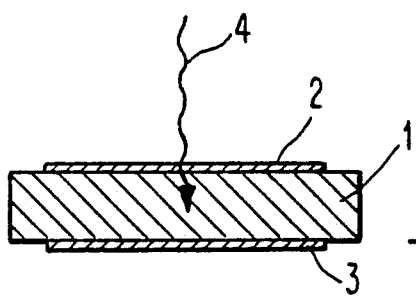
FIG. 26 is a sectional view showing a conventional radiation sensor.

FIG. 25a shows the frequency characteristics of the pulse amplifier, in which $f_c$ is a cutoff frequency of the pulse amplifier. FIGS. 25b to 25d show the output current pulse waveform from the pulse amplifier $V_e$ with induced current pulse $I_e$ shown in FIGS. 24a to 24c. The height of an output pulse can be adjusted by an appropriate combination of the frequency characteristics (i.e., the cutoff frequency) of the pulse amplifier and the pulse width (i.e., the pulse frequency) of an induced current pulse from the radiation sensor. In other words, this can be achieved by selecting a frequency $f_c$ so that $(1/T_e)$ of the induced current pulse shown in FIG. 24a is higher than $f_c$, that shown in FIG. 24b is near $f_c$ and that shown in FIG. 24c is lower than $f_c$. By selecting an appropriate value for the frequency $f_c$, $V_e$ can be regulated at a constant height as shown in these figures, that is, current pulses with a height independent of the position at which the electric charge is generated can be obtained.

As described above, according to the present invention, current pulses with a height independent of the position at which the electric charger is generated can be obtained by the use of a radiation sensor which utilizes a semiconductor substrate made of a compound semiconductor in which the mobility of electric charges is different and by increasing the transit distance of electric charges during the high-speed measurement of radiation photons with a high pulse rate by means of a pulse amplifier. This enables the radiation sensor to carry out the high-speed pulse measurement without losing the energy information of the incident radiation. Moreover, such an effect can be further improved by the disposition of a radiation incident window on the radiation sensor in view of the frequency band of the pulse amplifier.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A radiation sensor for the measurement of photon energies of incident radiation, which comprises a semiconductor substrate sensitive to photons of said incident radiation, at least one common electrode and at least one split electrode, both of which are disposed on the same surface of said substrate, wherein said at least one common electrode and said at least one split electrode comprise means for receiving an applied voltage so as to detect a current produced by said incident radiation.

2. A radiation sensor according to claim 1, wherein a combination of a common electrode and a split electrode is disposed in parallel with each other.

3. A radiation sensor according to claim 1, wherein a common electrode is disposed at the center of said surface of the substrate and two split electrodes are disposed on both sides of said common electrode.

4. A radiation sensor according to claim 3, wherein said two split electrodes are shifted to each other by a half pitch.

5. A radiation sensor according to claim 1, wherein a split electrode is disposed at the center of said surface of the substrate and two common electrodes are disposed on both sides of said split electrode.

6. A radiation sensor according to claim 1, wherein a first combination of a common electrode and a split electrode is disposed on one surface of said substrate and a second combination of a common electrode and a split electrode is disposed on the other surface of said substrate symmetrically with said first combination of electrodes.

7. A radiation sensor according to claim 1, wherein a passivation film is formed on the radiation-sensitive area of the substrate between said at least one common electrode and said at least one split electrode.

8. A radiation sensor according to claim 1, wherein said at least one common electrode has notches to form a symmetric distribution of the electric field between said at least one common electrode and said at least one split electrode.

9. A radiation sensor according to claim 1, wherein said substrate is made of a semiconductor material selected from the group consisting of CdTe, GaAs, GaSe, HgI$_2$, CdSe, Si, and Ge.

10. A radiation sensor for the measurement of photon energies of incident radiation, which comprises a semiconductor substrate sensitive to photons of said incident radiation, at least one common electrode disposed on one surface of said substrate, and at least one split electrode disposed on the other surface of said substrate at a diagonal position to said at least one common electrode, wherein said at least one common electrode and said at least one split electrode comprises means for receiving an applied voltage so as to detect a current produced by said incident radiation.

11. A radiation sensor according to claim 10, wherein a common electrode is disposed on one surface of said substrate and a split electrode is disposed on the other surface of said substrate at a diagonal position to said common electrode.

12. A radiation sensor according to claim 10, wherein a common electrode is disposed at the center of one surface of said substrate and two split electrodes are disposed on the other surface of said substrate at positions on both sides of said common electrode.

13. A radiation sensor according to claim 12, wherein said two split electrodes are shifted to each other by a half pitch.

14. A radiation sensor according to claim 10, wherein a split electrode is disposed at the center of one surface of said substrate and two common electrodes are disposed on the other surface of said substrate at positions on both sides of said split electrode.

15. A radiation sensor according to claim 10, wherein a passivation film is formed on the radiation-sensitive area of the substrate.

16. A radiation sensor according to claim 10, wherein said at least one common electrode has notches to form a symmetric distribution of the electric field between the at least one common electrode and the at least one split electrode.

17. A radiation sensor according to claim 10, wherein said substrate is made of a semiconductor material selected from the group consisting of CdTe, GaAs, GaSe, HgI$_2$, CdSe, Si, and Ge.

18. A radiation detecting apparatus comprising a radiation sensor and a pulse amplifier, wherein said radiation sensor includes a semiconductor substrate sensitive to photons of incident radiation, at least one common electrode and at least one split electrode, both of which are disposed on the same surface of said substrate, and wherein the radiation sensitive area of said sensor is limited by the disposition of a radiation shield in such a manner that the transit time of electrons or holes among electric charges generated by said incident radiation is equal to or greater than the reciprocal time of a cutoff frequency of said pulse amplifier.

19. A radiation detecting apparatus comprising a radiation sensor and a pulse amplifier, wherein said radiation sensor includes a semiconductor substrate sensitive to photons of incident radiation, at least one common electrode disposed on one surface of said substrate, and at least one split electrode disposed on the other surface of said substrate at a diagonal position to said at least one common electrode, and wherein the radiation sensitive area of said sensor is limited by the disposition of a radiation shield in such a manner that the transit time of electrons or holes among electric charges generated by said incident radiation is equal to or greater than the reciprocal time of a cutoff frequency of said pulse amplifier.

20. A radiation sensor for the measurement of photon energies of incident radiation, which comprises a semiconductor substrate sensitive to photons of said incident radiation, a common electrode disposed at the center of one surface of said substrate, and two split electrodes disposed on the same surface of said substrate on both sides of said common electrode.

21. A radiation sensor according to claim 20, wherein said two split electrodes are shifted with respect to each other by a half pitch.

22. A radiation sensor according to claim 20, wherein a passivation film is formed on the radiation-sensitive area of the substrate.

23. A radiation sensor according to claim 20, wherein said common electrode has notches located thereon, said notches forming a symmetric distribution of the electric field between the common electrode and the two split electrodes.

24. A radiation sensor according to claim 20, wherein said substrate is made of a semiconductor material selected from the group consisting of CdTe, CaAs, GaSe, HgI$_2$, CdSe, Si, and Ge.

25. A radiation sensor for the measurement of photon energies of incident radiation, which comprises a semiconductor substrate sensitive to photons of said incident radiation, a split electrode disposed at the center of one surface of said substrate, and two common electrodes disposed on the same surface of said substrate on both sides of said split electrode.

26. A radiation sensor according to claim 25, wherein a passivation film is formed on the radiation-sensitive area of the substrate.

27. A radiation sensor according to claim 25, wherein at least one of the common electrodes has notches located thereon, said notches forming a symmetric distribution of the electric field between said common electrode and the split electrode.

28. A radiation sensor according to claim 25, wherein said substrate is made of a semiconductor material selected from the group consisting of CdTe, CaAs, GaSe, HgI$_2$, CdSe, Si, and Ge.

29. A radiation sensor for the measurement of photon energies of incident radiation, which comprises a first combination of a common electrode and a split electrode which is disposed on one surface of a semiconductor substrate sensitive to photons of said incident radiation, and a second combination of a common electrode and a split electrode which is disposed on the other surface of said substrate symmetrically with respect to said first combination of electrodes.

30. A radiation sensor according to claim 29, wherein a passivation film is formed on the radiation-sensitive area of the substrate.

31. A radiation sensor according to claim 29, wherein said common electrode is at least one of said first and second combinations has notches located thereon, said notches forming a symmetric distribution of the electric field between said common electrode and the corresponding split electrode in the same combination.

32. A radiation sensor according to claim 29, wherein said substrate is made of a material selected from the group consisting of CdTe, GaAs, GaSe, HgI$_2$, CdSe, Si, and Ge.

33. A radiation sensor for the measurement of photon energies of incident radiation, which comprises a semiconductor substrate sensitive to photons of said incident radiation, a common electrode disposed at the center of one surface of said substrate, and two split electrodes disposed on the other surface of said substrate at diagonal positions to said common electrode on both sides of said common electrode.

34. A radiation sensor according to claim 33, wherein said two split electrodes are shifted with respect to each other by a half pitch.

35. A radiation sensor according to claim 33, wherein a passivation film is formed on the radiation-sensitive area of the substrate.

36. A radiation sensor according to claim 33, wherein said common electrode has notches located thereon, said notches forming a symmetric distribution of the electric field between the common electrode and the two split electrode.

37. A radiation sensor according to claim 33, wherein said substrate is made of a semiconductor material selected from the group consisting of CdTe, GaAs, GaSe, HgI$_2$, CdSe, Si, and Ge.

38. A radiation sensor for the measurement of photon energies of incident radiation, which comprises a semiconductor substrate sensitive to photons of said incident radiation, a split electrode disposed at the center of one surface of said substrate, and two common electrodes disposed on the other surface of said substrate at diagonal positions to said split electrode on both sides of said split electrode.

39. A radiation sensor according to claim 38, wherein a passivation film is formed on the radiation-sensitive area of the substrate.

40. A radiation sensor according to claim 38, wherein at least one of the common electrodes has notches located thereon, said notches forming a symmetric distribution of the electric field between said common electrode and the split electrode.

41. A radiation sensor according to claim 38, wherein said substrate is made of a semiconductor material selected from the group consisting of CdTe, GaAs, GaSe, HgI$_2$, CdSe, Si, and Ge.

* * * * *

UNITED STATES PATENT AND TRADEMARK OFFICE
CERTIFICATE OF CORRECTION

PATENT NO. : 5,111,052

DATED : May 5, 1992

INVENTOR(S) : Tetsuro Ohtsuchi et al.

It is certified that error appears in the above-identified patent and that said Letters Patent is hereby corrected as shown below:

<u>In the Drawings</u>

In Figs. 19a, 19b and 19c, "$T_r$" should read "$T_h$".

Signed and Sealed this

Fourteenth Day of September, 1993

Attest:

BRUCE LEHMAN

*Attesting Officer*  *Commissioner of Patents and Trademarks*